United States Patent
Chiricosta et al.

(10) Patent No.: US 9,071,260 B2
(45) Date of Patent: Jun. 30, 2015

(54) METHOD AND RELATED DEVICE FOR GENERATING A DIGITAL OUTPUT SIGNAL CORRESPONDING TO AN ANALOG INPUT SIGNAL

(71) Applicant: STMicroelectronics S.r.l., Agrate Brianza (IT)

(72) Inventors: Mario Chiricosta, Tremestieri Etneo (IT); Calogero Marco Ippolito, Aci Castello (IT); Mario Maiore, Aci Sant'Antonio (IT); Orlando Peluso, Mascalucia (IT); Michele Vaiana, Paterno' (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/447,050

(22) Filed: Jul. 30, 2014

(65) Prior Publication Data
US 2015/0035691 A1     Feb. 5, 2015

(30) Foreign Application Priority Data
Jul. 30, 2013 (IT) .............. MI2013A1273

(51) Int. Cl.
*H03M 1/20* (2006.01)
*H03M 1/06* (2006.01)
*H03M 1/12* (2006.01)

(52) U.S. Cl.
CPC .............. *H03M 1/0626* (2013.01); *H03M 1/20* (2013.01); *H03M 1/0639* (2013.01); *H03M 1/12* (2013.01)

(58) Field of Classification Search
CPC . H03M 1/0641; H03M 1/0639; H03M 1/201; H03M 3/328; H03M 3/33; H03M 3/334; H03M 3/476
USPC .......... 341/118, 120, 131, 139, 140, 143, 155
See application file for complete search history.

(56) References Cited

U.S. PATENT DOCUMENTS

| 4,144,577 | A |   | 3/1979 | Ley |
| 5,525,984 | A | * | 6/1996 | Bunker .................. 341/131 |
| 6,016,113 | A | * | 1/2000 | Binder .................. 341/131 |
| 6,064,328 | A | * | 5/2000 | Scheidig et al. ........... 341/155 |

(Continued)

FOREIGN PATENT DOCUMENTS

EP         2390638         11/2011

OTHER PUBLICATIONS

Search Report for Italian patent application No. MI20131273, Hague, Holland, Oct. 9, 2013, 2 pages.

(Continued)

*Primary Examiner* — Linh Nguyen
(74) *Attorney, Agent, or Firm* — Gardere Wynne Sewell LLP

(57) ABSTRACT

An embodiment of a circuit includes an input node, a generator, a combiner, a converter, and a filter. The input node is configured to receive an input signal in a first domain, and the generator is configured to generate a periodic signal in the first domain. The combiner is configured to combine the input and periodic signals into a resulting signal in the first domain, and the converter is configured to convert the resulting signal into a converted signal in a second domain. And the filter is configured to remove from the converted signal substantially all of a frequency component of the converted signal having substantially a same frequency as a frequency component of the periodic signal.

16 Claims, 7 Drawing Sheets

(56) References Cited

U.S. PATENT DOCUMENTS

| | | | |
|---|---|---|---|
| 6,433,723 B1* | 8/2002 | Randall | 341/155 |
| 7,015,851 B1* | 3/2006 | Bruhns et al. | 341/155 |
| 7,075,466 B1* | 7/2006 | Woodall et al. | 341/131 |
| 7,307,563 B2* | 12/2007 | Kim | 341/131 |
| 8,319,673 B2* | 11/2012 | Steensgaard-Madsen | 341/139 |
| 2006/0114144 A1* | 6/2006 | Lyden et al. | 341/161 |
| 2008/0143565 A1* | 6/2008 | Moore et al. | 341/131 |
| 2012/0013494 A1* | 1/2012 | Song | 341/122 |
| 2014/0091957 A1* | 4/2014 | Moldsvor et al. | 341/131 |

OTHER PUBLICATIONS

"A self-testing and calibration method for embedded successive approximation register ADC"—16th Asia and South Pacific Design Automation Conference (ASP-DAC) 2011.

"A practical self-calibration scheme implementation for pipeline ADC" IEEE Transactions on Instrumentation and Measurement 2004.

* cited by examiner

METHOD AND RELATED DEVICE FOR GENERATING A DIGITAL OUTPUT SIGNAL CORRESPONDING TO AN ANALOG INPUT SIGNAL

PRIORITY CLAIM

The instant application claims priority to Italian Patent Application No. MI2013A001273, filed 30 Jul. 2013, which application is incorporated herein by reference in its entirety.

TECHNICAL FIELD

This disclosure relates to analog-to-digital conversion and more particularly to a method and a related device for generating with great precision a digital signal corresponding to an analog signal.

SUMMARY

High-precision amplification chains for analog signal processing usually employ multiples acquisitions and averaging to increase resolution and reduce noise. A drawback of this approach is that linearity errors due to a nonlinearity interval of the input/output characteristic of the used analog-to-digital converter (ADC) are emphasized. The main cause of nonlinearity is the matching of analog components (for example, capacitor-bank matching in case of a switched-capacitor-based ADC). Therefore, a method to improve accuracy of analog-to-digital conversion, when the input/output characteristic of the used ADC may contain one or more nonlinearity intervals centered on an unknown point of the characteristic, is requested.

According to a technique proposed by B. Provost and E. Sanchez-Sinencio, "A practical self-calibration scheme implementation for pipeline ADC" IEEE Transactions on Instrumentation and Measurement 2004, which is incorporated by reference, a highly linear analog ramp (generated on-chip or off-chip during testing) is used, an integral nonlinearity (INL) measurement is performed and compensation coefficients are extracted. According to this technique, a calibration is substantially performed in the digital domain.

Other techniques compensate for the ADC linearity errors by using an additional programmable digital-to-analog converter (DAC), such as for example the one proposed by X.-L. Huang et al, "A self-testing and calibration method for embedded successive approximation register ADC"—16th Asia and South Pacific Design Automation Conference (ASP-DAC) 2011, which is incorporated by reference. The basic idea is to estimate the ADC linearity by measuring the major carrier transitions (MOTs) of the array of capacitors of the DAC. During calibration procedures, the array of capacitors of the DAC is controlled to generate the MOTs, which are then compensated by using an additional differential DAC. During the functioning, a compensation code is subtracted from the ADC output to obtain more accurate digital replicas of input signals to be converted.

FIG. 1 shows a simplified block diagram of an amplification chain AMP followed by an ADC, that converts an input analog signal IN into a digital signal, and by a DSP (Digital Signal Processor) that implements a further digital processing. The DSP typically implements a digital filter (not shown) in order to enhance accuracy and to reduce output noise, thus the corresponding digital output signal OUT is a weighted sum of values generated by the ADC.

FIG. 2a shows an exemplary output error characteristic of the conversion device of FIG. 1 in which missing codes are present. In this example, the digital filter of the DSP is a FIR (Finite Impulse Response) filter and generates each output value by averaging 512 samples obtained with a 14-bit ADC. FIG. 2b shows the 512 acquisitions made by the ADC for input voltage levels corresponding to an interval of the input/output characteristic of the ADC affected by high DNL (Differential NonLinearity) error.

The highlighted step variation and DNL peak in the input/output error characteristic of the ADC produces discontinuities in the input/output characteristic of the analog-to-digital conversion. These discontinuities produce accuracy errors which are often unacceptable in high-precision amplification chains for analog signal processing.

An embodiment of an innovative method of converting an analog signal to digital allows enhancing significantly the error characteristic of the conversion even when using an analog-to-digital converter with an input/output characteristic that may contain a nonlinearity interval.

An embodiment of this method, implemented in a related device, includes the steps of:

adding, to the analog input signal, a periodic signal having a main frequency smaller than half of a sampling frequency of the analog-to-digital converter and an amplitude greater than an estimated amplitude of the nonlinearity interval generating thereby a sum signal;

converting into digital form the sum signal with the analog-to-digital converter, generating thereby a corresponding digital sum signal;

filtering the digital sum signal with a digital filter, the frequency response of which has zeroes in correspondence of all pulses of the frequency spectrum of the digital sum signal due to the periodic signal, generating the digital output signal as a filtered replica of the digital sum signal.

The periodic signal may be for example a triangular signal, or a square-wave signal, or a sinusoidal signal.

DETAILED DESCRIPTION

The herein proposed technique can improve the ADC linearity error by adding a periodic signal with a null DC value before the conversion in the digital domain. This periodic signal is added to the ADC input and is then filtered, for example through an averaging process, in the digital domain. The approach does not require any modification to the original analog/digital section and does not require any additional calibration procedure.

Figure 3:
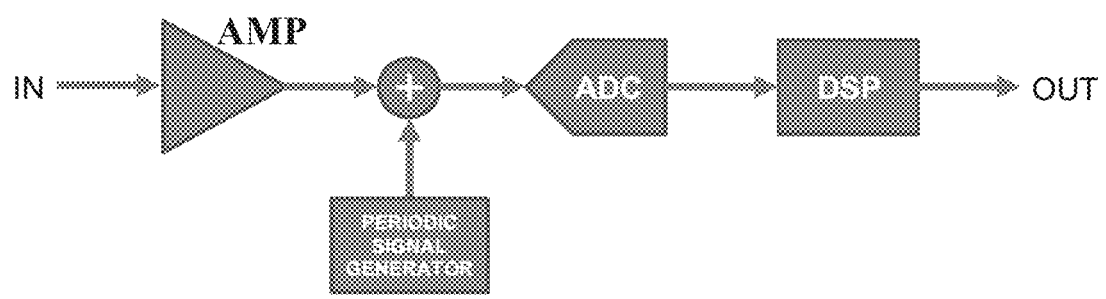
FIG. 3 depicts a basic block diagram a conversion device for generating a digital output signal corresponding to an analog input signal, according to an embodiment.
Figure 2A:
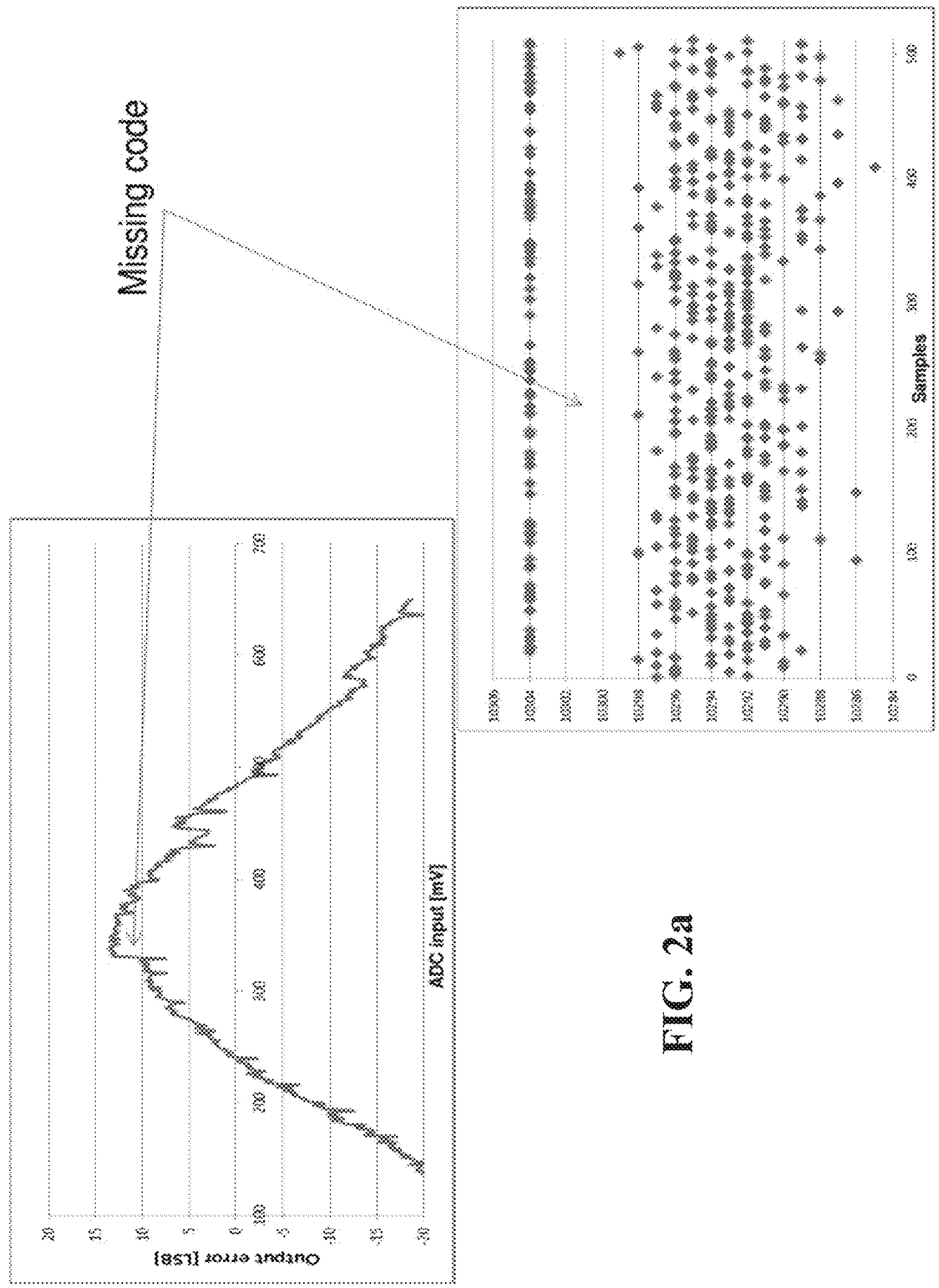
FIG. 2a shows the effects of the presence of a nonlinearity interval with missing codes in the error characteristic of the conversion device of FIG. 1.
Figure 2B:
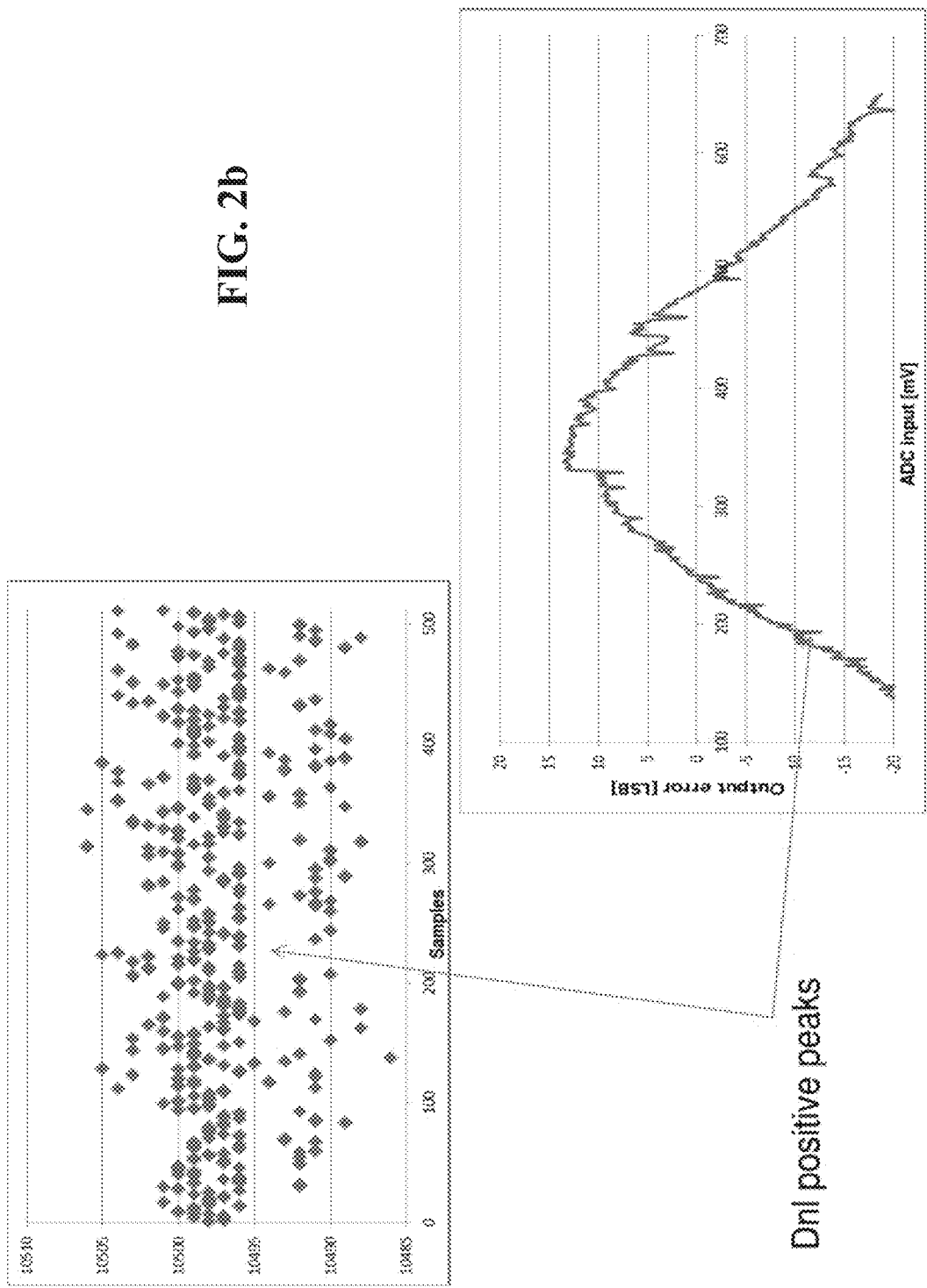
FIG. 2b shows the effects of the presence of a nonlinearity interval with a DNL positive peak in the error characteristic of the conversion device of FIG. 1.

A block diagram of a conversion device according to an embodiment is depicted in FIG. 3. According to an embodiment of the herein disclosed technique, a periodic signal is added to the ADC input voltage before conversion to the digital domain: this operation may be done irrespectively at the output of the amplifier AMP, as shown in the cited figure, or at the input of the amplifier, or even in the ADC itself before conversion to the digital domain.

The periodic signal needs not to be mandatorily an analog signal. For example, if the amplifier AMP is a discrete time amplifier, the periodic signal may be a discrete time signal and the ADC may be a digital-to-analog converter (DAC). That is, an embodiment of the technique described herein can reduce errors caused by the nonlinearity of a DAC.

It will be shown hereinafter that this technique allows reducing the number of acquisitions carried out in correspondence of input levels corresponding to any eventual nonlinearity interval of the input/output characteristic of the ADC at which the output signal is affected by a relatively great DNL error.

The periodic signal may be any continuous or discrete time periodic signal whose main frequency fs/N (wherein fs is the ADC sampling frequency and N is an integer number) and all harmonic frequency tones coincide with zeroes of the frequency response of the digital filter (contained in the DSP) that generates the output digital signal by filtering the digital signal generated by the analog-to-digital converter. If, for example, the digital filter is a FIR (Finite Impulse Response) and the number of samples from the ADC used for the filtering is equal to M, the output signal is given by $$y[n] = \sum_{k=0}^{M-1} b_k \cdot x[n-k] \quad (1)$$

and the frequency response of the digital filter is given by $$H(\omega) = H(z)|_{z=e^{j\omega}} = \sum_{k=0}^{M-1} b_k \cdot e^{-jk\omega} \quad (2)$$

Any periodic signal, whose frequency spectrum only includes tones centered on the zeroes of equation (2), is filtered out by the FIR.

If the DC value of the periodic signal is not zero, then the output signal will be affected by an offset component that may be easily removed.

Figure 4:
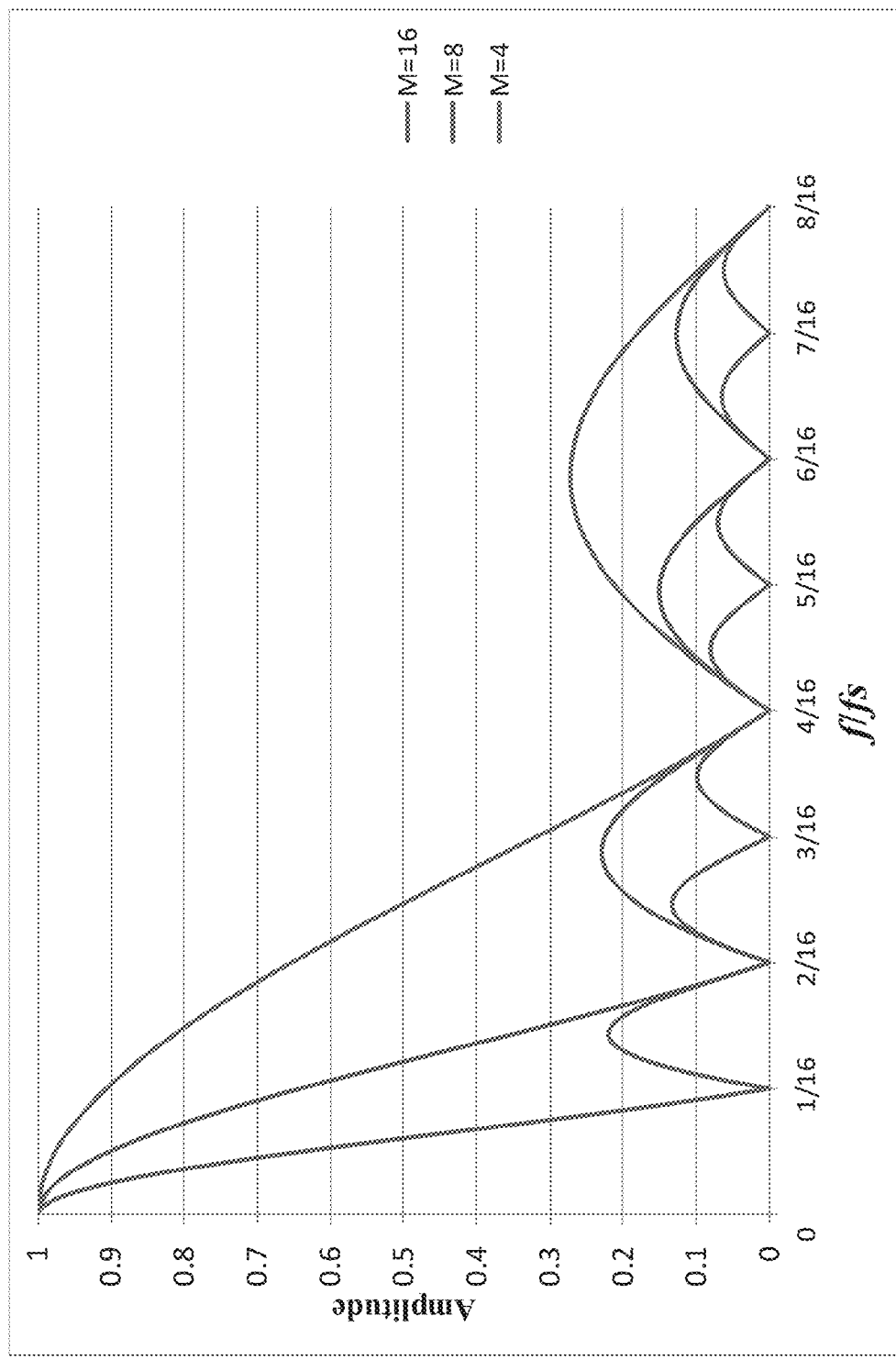
FIG. 4 shows exemplary frequency responses of a moving average filter for three different numbers of samples used for calculating moving averages, according to an embodiment.

Considering, as an example, that the digital filter is a moving average filter, the frequency response of the digital filter is $$|H(f)| = \frac{\sin(\pi f M)}{M \cdot \sin(\pi f)} \quad (3)$$

and the frequency response for three values of M is depicted in FIG. 4.

For a moving average filter the frequency response presents the following zeros $$\left\{ 1 \cdot \frac{f_s}{M}, 2 \cdot \frac{f_s}{M}, 3 \cdot \frac{f_s}{M}, \ldots \ldots, k \cdot \frac{f_s}{M} \right\} \quad (4)$$

for k/M less than or equal to ½.

Figure 5A:
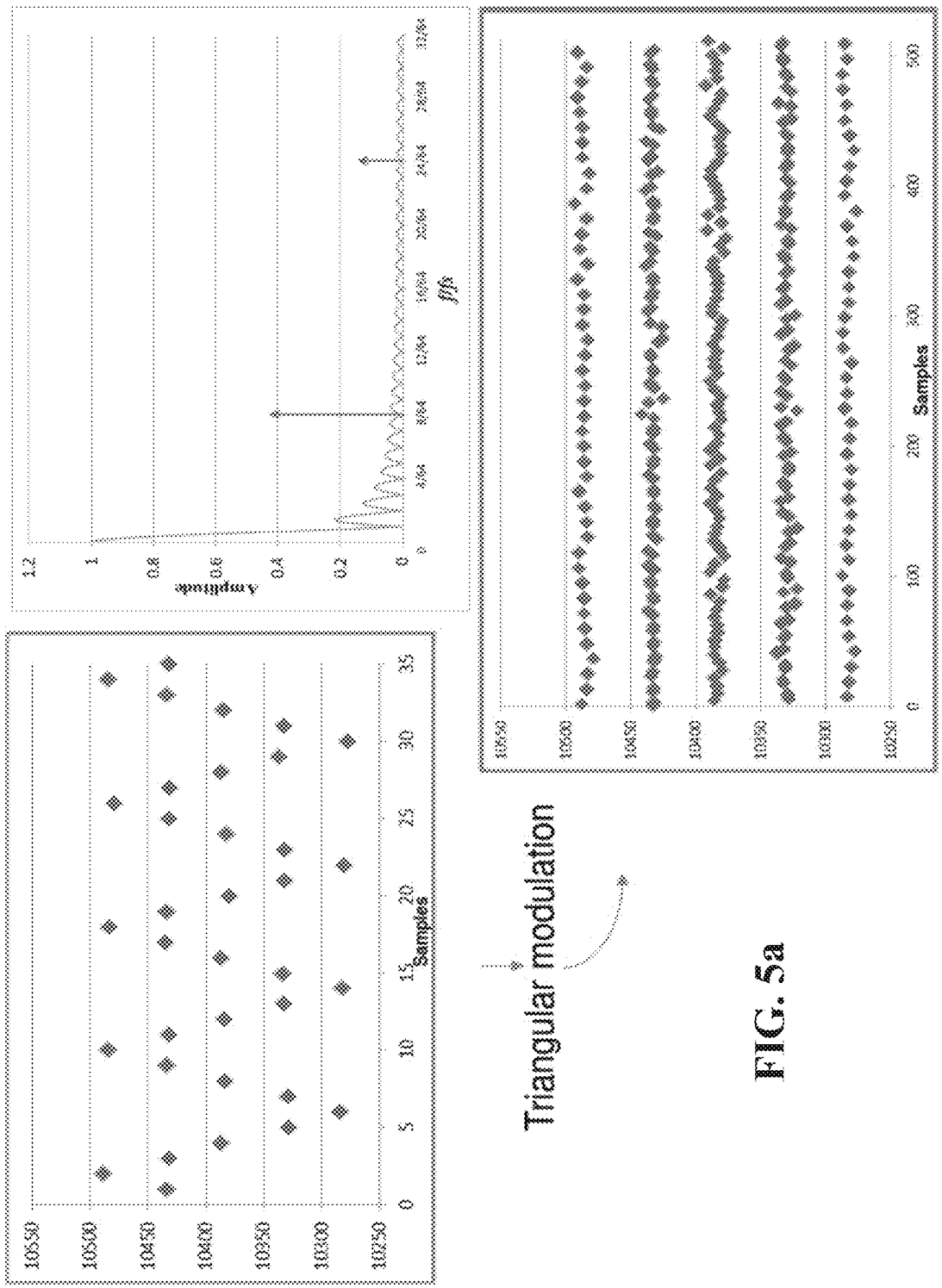
FIGS. 5a and 5b illustrate a simulated functioning of the conversion device of FIG. 3 that adds a triangular waveform or a sinusoidal waveform, respectively, to an input signal to be converted, according to an embodiment.

Let's suppose that the DSP unit integrates a moving average filter which generates each value of the output signal by averaging 512 points of the ADC output, that means M=512, and that the periodic signal is a periodic triangular waveform with a frequency equal to fs/8, that means N=8. In this considered exemplary case, the periodic signal modulates the ADC output as shown in FIG. 5a.

Within the Nyquist frequency fs/2, the considered triangular waveform frequency spectrum has two tones at fs/8 and at 3*fs/8, which coincide with zeroes of the frequency response of the moving average filter (for M=512). As a consequence, the triangular waveform does not affect the digital output signal because it is cancelled by the filter.

Supposing that the input value corresponding to 10380 LSB is a high DNL error value, thanks to the modulation imposed by the triangular waveform only one sample out of four will be evaluated at around 10380 LSB. In other words, when the ADC input corresponds to a high DNL error level, then a reduced number of conversions will be done at this input level and consequently the weight of the linearity error is decreased. In the proposed example the DNL error is reduced by four times, that is N/2 times.

Figure 5B:
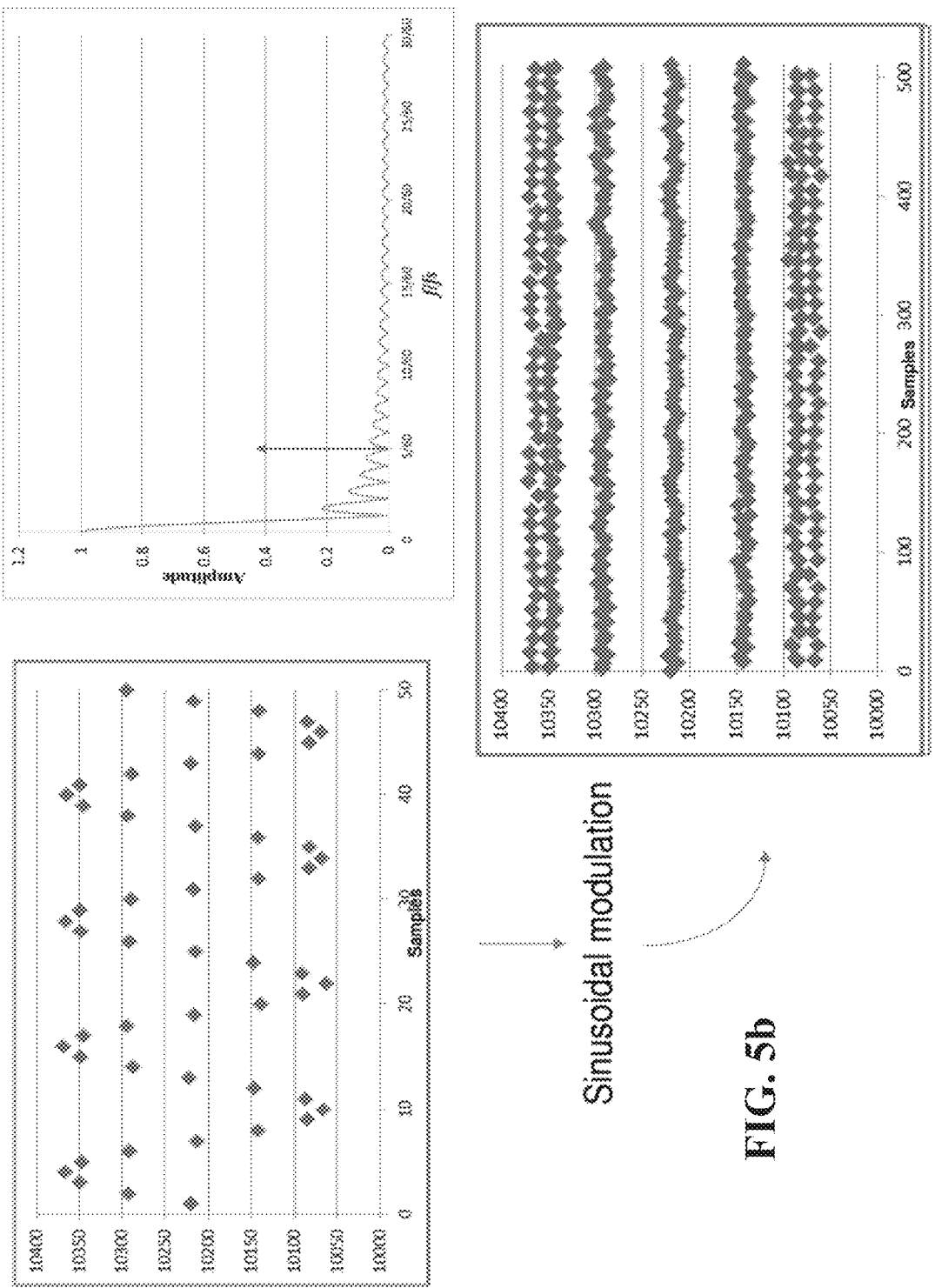

Comparable results are obtained using a sinusoidal periodic signal, as shown in FIG. 5b.

Figure 1:
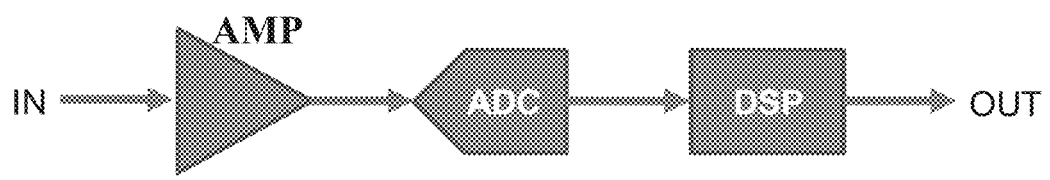
FIG. 1 depicts a known basic block diagram of a conversion device for generating a digital output signal corresponding to an analog input signal.
Figure 6:
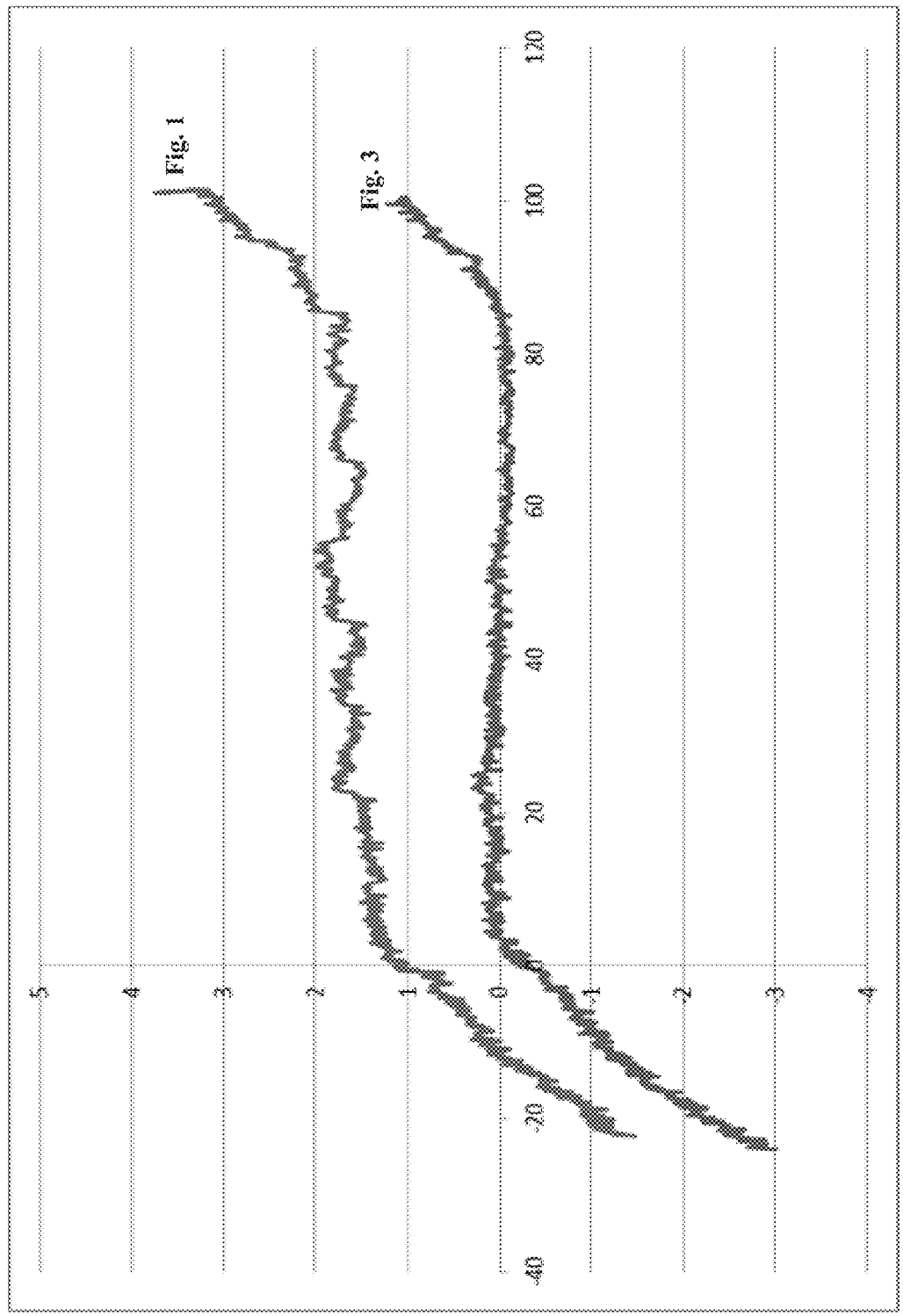
FIG. 6 compares exemplary error characteristics of a temperature dependent analog input converted using the device of FIG. 3 and the known conversion device of FIG. 1.

FIG. 6 compares error characteristics obtained by coupling an analog temperature dependent input to the device of FIG. 3, and by connecting the same input to the device of FIG. 1. The temperature has been varied from −20° C. up to 100° C. such to generate an analog sense voltage that increases linearly. The device of FIG. 3 and the conversion device of FIG. 1 were coupled such to convert the analog sense voltage into a digital signal. From the comparison graph of FIG. 6 it is evident that the device of FIG. 3 ensures an enhanced reduction of nonlinearity errors.

An embodiment of the proposed technique provides a DNL error attenuation equal to N/2, thus the integer number N (i.e., the ratio between the sampling frequency fs and the frequency of the periodic signal) is chosen to be as great as possible. The maximum value of N is N=M, in which M is the number of points used for the digital filter averaging.

However, the maximum value of N should be determined to take into account also the following issues:

the amplitude of the periodic signal limits the maximum amplitude of the analog input signal that may be converted, because the ADC has a saturated conversion characteristic;

in order to distribute the ADC samples on different levels, the distance between two consecutive samples of the periodic signal, which is tied to the amplitude of the periodic signal and to the number N and which is about 50 LSB in the example of FIG. 5a, may be determined such as to be greater than the level of noise corrupting the analog input signal to be converted, otherwise the reduction of the DNL error could become negligible;

if the peak-to-peak amplitude of the periodic signal, which is about 200 LSB in the example of FIG. 5a, is already greater than two consecutive high DNL error levels of the ADC, the DNL error attenuation is not more enhanced by increasing further the amplitude of the periodic signal.

With the above indications, one may choose the sampling frequency fs, the amplitude of the periodic signal, and the ADC to be used depending upon the maximum amplitude of an input signal to be converted, and then he may select an allowable number N in order to meet all the above objectives.

Furthermore, the circuit of FIG. 3 may be disposed on an integrated circuit, and may be part of a system in which the circuit of FIG. 3 may be coupled to another circuit, for example, a computing circuit such as a microprocessor or microcontroller. And the circuit of FIG. 3 and the other circuit may be disposed on a same integrated-circuit die, or on respective integrated-circuit dies.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A circuit, comprising:
an input node configured to receive an input signal in a first domain;
a generator configured to generate a periodic signal in the first domain, said periodic signal having a main frequency and first tones which are harmonics of the main frequency;
a combiner configured to combine the input and periodic signals into a resulting signal in the first domain;
a converter configured to sample the resulting signal at a sampling frequency and convert the sampled resulting signal into a converted signal in a second domain; and
a filter having a frequency response including zeroes at a plurality of second tones with passbands between adjacent second tones, said filter configured to remove frequency components of the periodic signal from the converted signal;
wherein the main frequency is equal to an integer fraction of the sampling frequency of the converter and the harmonic first tones of the periodic signal are centered on ones of the second tones for the zeroes of the frequency response.

2. The circuit of claim 1 wherein:
the first domain is an analog domain; and
the second domain is a digital domain.

3. The circuit of claim 1 wherein:
the first domain is a digital analog domain; and
the second domain is an analog domain.

4. The circuit of claim 1 wherein the periodic signal is a sinusoid.

5. The circuit of claim 1 wherein the periodic signal is a triangle wave.

6. The circuit of claim 1 wherein the periodic signal is a square wave.

7. The circuit of claim 1 wherein the combiner is an adder.

8. The circuit of claim 1 wherein the converter is a digital-to-analog converter.

9. The circuit of claim 1 wherein the converter is an analog-to-digital converter.

10. The circuit of claim 1 wherein the filter is a finite-impulse-response filter.

11. A system, comprising:
a first integrated circuit including
an input node configured to receive an input signal in a first domain,
a generator configured to generate a periodic signal in the first domain, said periodic signal having a main frequency and first tones which are harmonics of the main frequency,
a combiner configured to combine the input and periodic signals into a resulting signal in the first domain,
a converter configured to sample the resulting signal at a sampling frequency and convert the sampled resulting signal into a converted signal in a second domain, and
a filter having a frequency response including zeroes at a plurality of second tones with passbands between adjacent second tones, said filter configured to remove frequency components of the periodic signal from the converted signal;
wherein the main frequency is equal to an integer fraction of the sampling frequency of the converter and the harmonic first tones of the periodic signal are centered on ones of the second tones for the zeroes of the frequency response; and
a second integrated circuit coupled to the first integrated circuit.

12. The system of claim 11 wherein the first and second integrated circuits are disposed on a same integrated-circuit die.

13. The system of claim 11 wherein the first and second integrated circuits are disposed on respective integrated-circuit dies.

14. The system of claim 11 wherein one of the first and second integrated circuits includes a computing circuit.

15. A method, comprising:
generating an output signal in a first domain in response to a first input signal and a periodic second input signal, said periodic second input signal having a main frequency and first tones which are harmonics of the main frequency;
converting the output signal from the first domain to a second domain by sampling the output signal at a sampling frequency; and
removing frequency components of the periodic second input signal from the converted output signal by filtering with a filter having a frequency response including zeroes at a plurality of second tones with passbands between adjacent second tones;
wherein the main frequency is equal to an integer fraction of the sampling frequency and the harmonic first tones of the periodic second input signal are centered on ones of the second tones for the zeroes of the frequency response.

16. The method of claim 15 wherein generating the output signal includes superimposing one of the first and second input signals on the other of the first and second input signals.

* * * * *